United States Patent [19]

Lacour et al.

[11] Patent Number: 4,541,124
[45] Date of Patent: Sep. 10, 1985

[54] MICROWAVE MIXER

[75] Inventors: Clément F. Lacour; Yannick Latouche, both of Paris, France

[73] Assignee: Thomson CSF, Paris, France

[21] Appl. No.: 500,863

[22] Filed: Jun. 3, 1983

[30] Foreign Application Priority Data

Jun. 8, 1982 [FR] France ............................... 82 09957

[51] Int. Cl.³ .............................................. H04B 1/26
[52] U.S. Cl. ..................................... 455/327; 455/330
[58] Field of Search ............................ 455/325–328, 455/330

[56] References Cited

U.S. PATENT DOCUMENTS 3,523,260 8/1970 Gunshinan et al. .
3,939,430 2/1976 Dickens et al. .
4,340,975 7/1982 Onishi et al. ........................ 455/327
4,359,781 11/1982 Hallford ............................. 455/327
4,380,829 4/1983 Stevenson et al. ................. 455/327
4,412,354 10/1983 Hu ...................................... 455/327
4,461,040 7/1984 Dobrovolny ....................... 455/327

FOREIGN PATENT DOCUMENTS 3018307 11/1981 Fed. Rep. of Germany .

OTHER PUBLICATIONS

Patents Abstracts of Japan, vol. 5, No. 133 (E–71) (805), 25 Aout 1981 & JA-A-56-71307, (Mitsubishi Denki K.K.), 13-06-1981.
Patents Abstracts of Japan, vol. 6, No. 28 (E-95) (906) 19 Fevrier 1982 & JP-A-56-149805 (Mitsubishi Denki K.K.), 19-11-1981.
Patents Abstracts of Japan, vol. 5, No. 159 (E-77) (831) & JP-A-56-87901 (Matsushita Denki Sangyo K.K.) 17-07-1981.
Patents Abstracts of Japan, vol. 2, No. 149, Dec. 13, 1978, p. 9432E77, & JP-A-52-113661.
EP-A-0 022990 (Siemens A.G.) 4/1981.

Primary Examiner—Jin F. Ng
Attorney, Agent, or Firm—Cushman, Darby & Cushman

[57] ABSTRACT

The mixer comprises two parallel conductors placed on each side of a substrate, two diodes mounted in series between the first ends of the two conductors, an incident-wave input connected between the second conductor-end located on the second face of the substrate and a ground line located on the first face, a mixing-wave input connected to means for applying between the ends of each diode an electric field produced by the mixing wave, and a mixed-wave output connected between at least one end of a diode and the ground line. The end of the conductor of the two-wire line is left free and electrically isolated from the ground line by means of a gap.

9 Claims, 3 Drawing Figures

MICROWAVE MIXER

BACKGROUND OF THE INVENTION

This invention relates to microwave diode mixers for use at frequencies approximately within the range of 2 to 18 GHz and more particularly to symmetrical balanced two-diode mixers.

The operation which consists in mixing two sine-wave signals having different frequencies by means of one or a number of diodes is well-known.

In the type of mixer which is constructed with a single diode, the signal applied between the ends of the diode is the sum of an incident signal S having an angular frequency $\omega_S$ and of a signal having an angular frequency $\omega_L$ transmitted by a local oscillator. The resultant output signal has a spectrum composed of a plurality of angular frequencies $\omega_{imn} = \pm m\omega_S \pm n\omega_L$, where m and n are integers, each component of which can be isolated by a filter in order to be utilized.

Mixers having a number of diodes are usually of the symmetrical type, which means that only one-half of the diodes are conductive at any given moment. In the same manner as one-diode mixers, symmetrical mixers make it possible to obtain an intermediate frequency whose angular frequency represents the difference in angular frequencies of the fundamental components of the incident signal and of the signal formed by the local oscillator. Compared with one-diode mixers, symmetrical mixers have the advantages of suppressing certain intermodulation products in which the even harmonics of the signal appear, and of permitting recovery of the image frequency of the incident signal on condition, however, that they are perfectly balanced or in other words that the access signal or the signal of the local oscillator can be equally or symmetrically distributed in each diode.

In accordance with one method which may be mentioned by way of example, this state of balance is obtained in a symmetrical two-diode mixer by placing the diodes of the mixer at the terminals of the secondary winding of a midpoint or center-tap transformer. The incident signal is applied to the terminals of the primary winding and the signal delivered by the local oscillator is applied between the connecting point which is common to the two diodes and the midpoint of the transformer. A further advantage offered by this design is that, should the need arise, isolation could be provided between the ground line which carries the incident signal and the ground line which carries the signal of the local oscillator.

Unfortunately, a device of this type is not directly applicable to the construction of microwave mixers on account of the difficulties involved in the construction of wound transformers which are utilizable within these frequency ranges. The adaptation of this design solution to the microwave field calls for the use of a microwave circuit which, from a functional standpoint, is equivalent to the midpoint transformer employed for lower frequency ranges. In point of fact, microwave couplers having this property are already known and are designated as balun couplers, which is an abbreviation of the term balanced-unbalanced couplers. These devices are constructed either by means of coaxial lines or by means of waveguides constituted by microstrip circuits deposited by metallization on a substrate.

In the first form of construction, the coupler consists of a first coaxial line having a length equal to one-quarter of the wavelength of the incident signal and connected at one end to the inputs of two other coaxial lines, said inputs being coupled in parallel. In this configuration, the incident signal is applied to the free end of the quarter-wave coaxial line and the symmetrical signals are collected at the respective outputs of the other two coaxial lines.

In the other form of construction, the coupler is placed within a connection box and is constituted by a microstrip waveguide constituted by two parallel lines having a length equal to one-quarter of the wavelength of the incident signal. One line is connected to ground at the waveguide end to which the incident signal is applied. The symmetrical signals are collected at the other end of the waveguide respectively between each end of the lines and the ground of the circuit.

So far as dimensional considerations are concerned, the form of construction involving the use of a microstrip waveguide is often preferred to the design consisting of coaxial lines since it permits much smaller dimensions of the connection box. It is in fact sought to obtain maximum reduction of the dimensions of the mixer box in order to guard against parasitic resonance phenomena which may arise as soon as operation of the mixer takes place within a frequency zone in the vicinity of 10 GHz.

However, such a reduction no longer appears to be possible below a certain limit which, as explained earlier, appears to be closely related to one-quarter of the wavelength of the signal defining the length of the coupler and below which the signals collected at the output of the coupler are no longer symmetrical.

A further problem which claims attention and which interferes considerably with the reduction in dimensions of the mixer arises from the fact that balun-type type microstrip couplers do not permit the possibility of isolating the grounds of the local oscillator and of the incident signal, with the result that there is a potential danger of short-circuiting of the ends of the diodes connected to the output of the coupler or of grounding of the incident signal via the ground circuit which forms part of the local oscillator. These short-circuits can be prevented if a sufficient length of metallization separates the connection points of the diodes from the ground points on which the incident signal and the signal of the local oscillator are applied. This arrangement naturally prevents any reductions in dimensions of the desired mixer and increases the risks of parasitic resonance within the connection box.

SUMMARY OF THE INVENTION

The object of this invention is to provide a microwave mixer by means of microstrip lines and slotted lines having dimensions which are appreciably smaller than those of mixers of the prior art without being limited to insuperable difficulties or attended by the disadvantages mentioned in the foregoing.

To this end, the invention is directed to a microwave mixer comprising a two-wire line constituted by two parallel conductors placed respectively on a first face and on a second face of a substrate, one or a number of diodes mounted in series at a first end of the two-wire line and between the two conductors located at said end, an incident-wave input connected to the second end of the two-wire line between the conductor located at said end on the second face of the substrate and a ground line located on the first face, a mixing-wave input connected to means for applying, between the ends of each diode, an electric field produced by the mixing wave, and a mixed-wave output connected between at least one end of a diode and the ground line. The distinctive feature of the microwave mixer lies in the fact that the end of the conductor located on the first face at the second end of the two-wire line is left free and electrically isolated from the ground line by means of a gap.

The main advantage of this arrangement is that the two-wire line can thus be given a length which is much shorter than one-quarter of the wavelength of the incident wave and accordingly permits a considerable reduction in the dimensions of the mixer.

BRIEF DESCRIPTION OF THE DRAWINGS

Other features of the invention will be more apparent upon consideration of the following description and accompanying drawings, wherein.

DETAILED DESCRIPTION OF THE INVENTION

Figure 1:
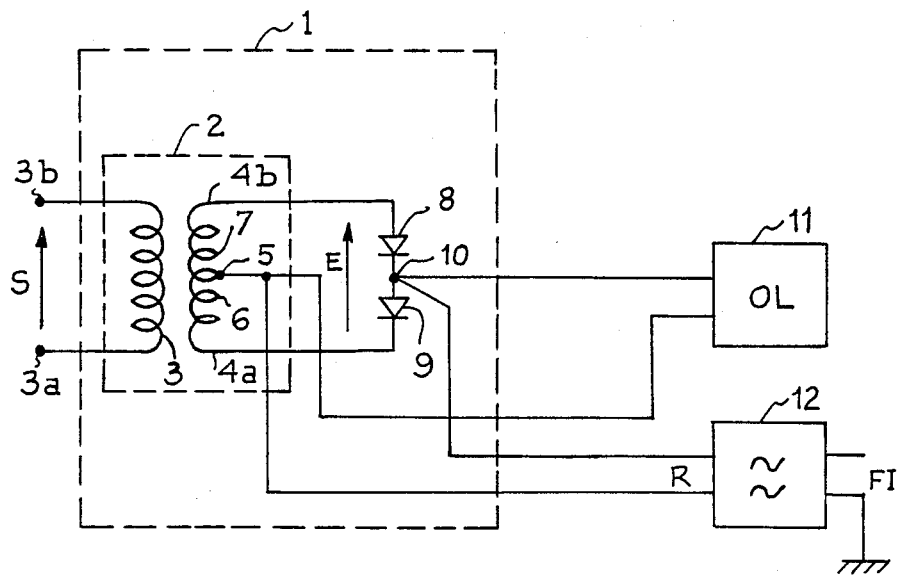
FIG. 1 is a schematic diagram of a symmetrical two-diode microwave mixer constructed in accordance with the invention.

The mixer shown within the dashed-line rectangle 1 in the schematic diagram of FIG. 1 is constituted by a transformer 2 comprising a primary winding 3, a secondary winding 4 provided with a midpoint or center tap 5 so as to form two half-windings 6 and 7. Two diodes 8 and 9 are mounted in series between the ends 4a and 4b of the secondary winding 4, the cathode of one diode being connected to the anode of the other diode so as to form a common connecting point 10. The incident signal S to be mixed is applied by an external signal source (not shown) between the ends 3a and 3b of the primary winding 3 and the mixing signal OL is applied between the point 10 which is common to the two diodes 8 and 9 and the center tap 5 of the secondary winding 4 by a local oscillator 11. The mixed signal R is obtained between the point 10 which is common to the two diodes and the center tap 5 of the secondary winding 4 and is applied to the input of a filter 12 so as to recover an intermediate frequency F1.

Figure 2:
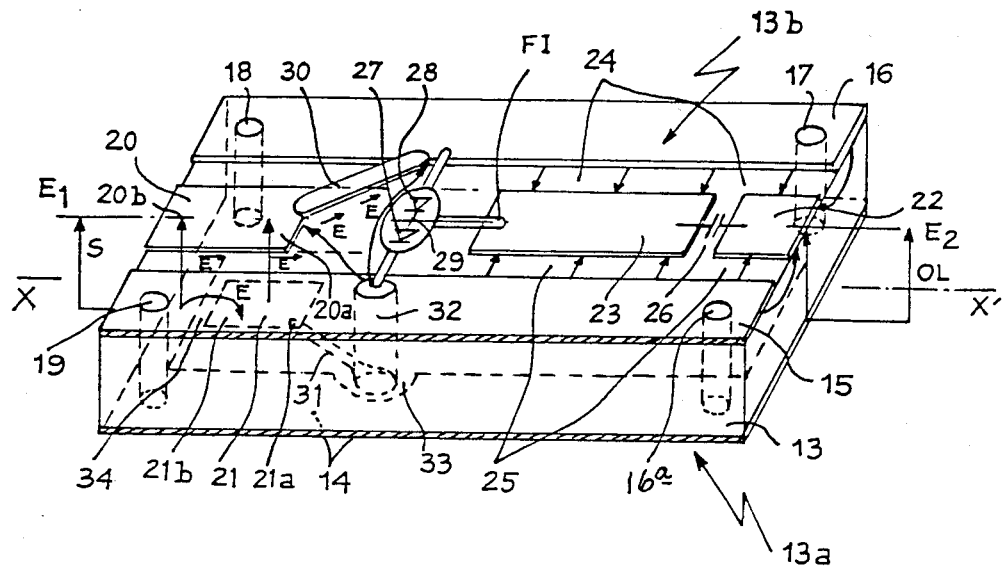
FIG. 2 illustrates one embodiment of the invention in which the mixer of FIG. 1 is constructed in accordance with the microstrip waveguide technique.

One embodiment in accordance with the invention and applying the principle of the mixer of FIG. 1 is illustrated in FIG. 2. In this figure, the mixer comprises a substrate 13 composed of two flat rectangular faces 13a and 13b which are parallel to each other and spaced at a distance of approximately 1/10 mm. The substrate consists of material having high permittivity such as magnesium titanate, alumina or teflon glass. A ground line 14 is deposited by strip metallization or any similar method on the periphery of the first face 13a. A second line 15 and a third line 16 are deposited by strip metallization or any similar method on the second face 13b of the substrate along the respective longitudinal sides of the rectangle which delimits the face 13b.

The ends of the lines 15 and 16 are connected to the ground line 14 located on the opposite face by means of metallized holes 16a, 17, 18, 19 extending right through the substrate from one face to the other and located at the four corners of this latter. A conductor 20 is placed by strip metallization or any like means on the second face 13b of the substrate at a first end $E_1$ of the longitudinal axis X—X' of the substrate between the lines 15 and 16 in a direction parallel to these latter. A second conductor 21 which is parallel and has a length approximately equal to the conductor 20 is placed by strip metallization or any like means on the first face 13a of the substrate directly beneath the conductor 20 within the contour formed by the ground line 14. Two other lines 22 and 23 are also deposited in end-to-end relation by strip metallization or the like on the second face 13b of the substrate between the lines 15 and 16 in a direction parallel to these latter so as to form two slotted lines 24 and 25. The line 22 is placed at the second end $E_2$ of the longitudinal axis X—X' of the substrate and is separated from a first corresponding end of the line 23 by a capacitor 26 connected to each end of the lines 22 and 23, thus coupling these two lines together. Two diodes 27 and 28 of the type designated as D5846A and manufactured by Alpha are mounted in series on the one hand between the inner edges of the lines 15 and 16 and on the other hand between the conductor 20 and the line 23 in a direction approximately perpendicular to the longitudinal axis of the substrate so as to ensure that the anode of the diode 28 is connected to the inner edge of the line 16 and that the cathode of the diode 27 is connected to the inner edge of the line 15. The common point 29 which provides a connection between the two diodes 27 and 28 is connected to the second end of the line 23. The end 20a of the conductor 20 which is directly opposite to the diodes 27 and 28 is connected by means of a conductor 30 to one point of the inner edge of the line 16 in immediate proximity to the point of connection of the diode 28 to the inner edge of the line 16. In a rather similar manner, the end 21a of the conductor 21, which is nearest the diodes 25 and 26 and located on the other side of the substrate with respect to these latter, is connected to one point of an inner edge of the line 15 by means of a conductor 31 and by means of a metallized hole 32. Said hole is located in immediate proximity to the point of connection of the diode 27 and extends right through the substrate from one side to the other.

In order to prevent any short-circuit towards the ground line 14 of the high-frequency signal which is present on the line 15 at the level of the metallized hole 32, a recess 33 may be formed if necessary in the ground line 14 in order to isolate the metallized hole 32 from said ground line 14. The end 21b remote from the end 21a of the conductor 21 is left free and electrically isolated from the ground line 14 in the vicinity of the first end $E_1$ of the longitudinal axis of the substrate by means of a gap 34 having a width of a few hundreds of microns which prevents that end of the diode 27 which is connected to the metallized hole 32 from short-circuiting to ground and provides an artificial means of increasing the electrical length of the conductor 21 by a length corresponding to the value of the capacitance produced by the gap or slot 34.

It is apparent that this arrangement is of major importance for achieving the object contemplated by the invention since the coupler formed by the conductors 20 and 21 can thus have a length which is considerably smaller than one-quarter wavelength of the incident wave of the signal S.

The operation of the mixer as illustrated in FIG. 2 is as follows: the electric field $\vec{E}$ of the incident signal is applied between the end 20b of the conductor 20 and the ground line 14 located directly opposite to this latter. The field $\vec{E}$ is propagated to the ends 20a and 21a of the parallel conductors 20 and 21 by the waveguide formed by these two conductors and by means of the slot formed by the gap 34 between the ground line 14 and the end 21b of the conductor 21.

The field $\vec{E}$ which is present at the ends 20a and 21a is derived from a potential V (not shown) which represents the potential difference developed at the terminals of the ends 20a and 21a. This potential difference V appears by virtue of the metallized hole 32 at the terminals of the diodes 27 and 28 at the corresponding inner edge of the lines 15 and 16. In consequence, the electric field $\vec{E}$ is again produced at the levels of the diodes in the same direction as these latter. Since the diodes have approximately equal values of resistance, the incident field $\vec{E}$ is equally distributed within these latter.

Furthermore, the electric field transmitted by the local oscillator is applied to the end $E_2$ of the substrate between the opposite end of the line 22 and the ground line 14. Owing to the presence of the metallized holes 17 and 16a located at the end $E_2$, the electric field produced by the local oscillator propagates in the longitudinal direction of the slotted lines 24 and 25 up to the diodes along field vectors of opposite orientation. Mixing is consequently performed in succession in each of the diodes which appear to be mounted in top-to-tail relation when looking from the local oscillator. The product of the mixing is collected on the end of the line 23 which is connected to the midpoint 29.

Figure 3:
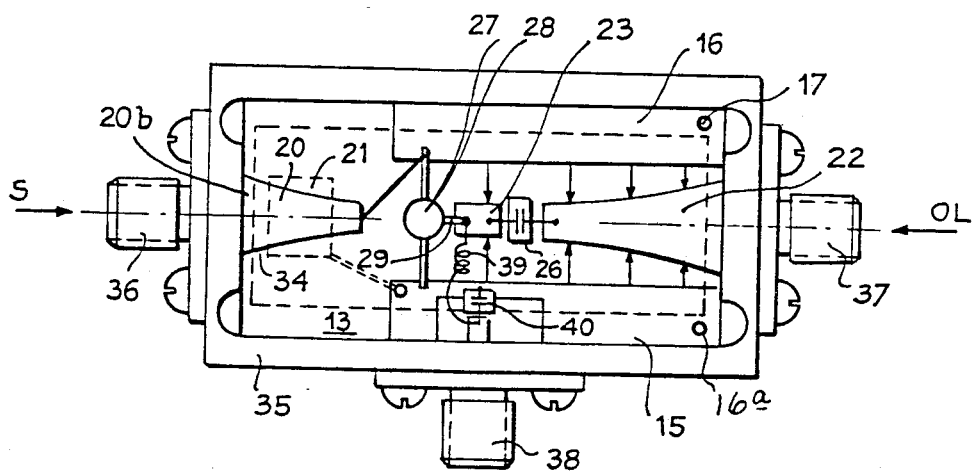
FIG. 3 illustrates a second embodiment of the mixer within its casing.

A second embodiment of the mixer described in the foregoing is illustrated in the top view of FIG. 3 and shown within a casing 35 of rectangular shape. Said casing is provided with three coaxial terminals 36, 37 and 38. The terminal 36 provides a connection between the end 20b of the conductor 20 and an external coaxial cable (not shown in the drawings) which carries the incident signal. The terminal 37 provides a connection between that end of the line 22 which is located at the end $E_2$ of the mixer and an external coaxial cable (not shown) which carries the signal delivered by a local oscillator (also omitted from the drawings). The terminal 38 is connected to the midpoint 29 of the diodes by means of a low-pass filter constituted by an inductance 39 and a capacitor 40 in order to transmit to the exterior a signal having an intermediate frequency F1.

It is noted in FIG. 3 that, in contrast to FIG. 2, the length of the lines 15 and 16 no longer corresponds to the length of the longitudinal dimension of the substrate and stops at the level of the points of attachment of the diodes 27 and 28. This design makes it possible to check whether the incident field is in fact propagated between the conductors 20 and 21 and not in the two slotted lines formed by the conductor 21 and the lines 15 and 16 as one could have been led to expect from the configuration of the ground planes. It is in fact apparent, again with reference to FIG. 2, that the slotted line placed between the conductor 20 and the ground line 16 is short-circuited by the conductor 30 and it has been found by experience that no field existed at the other end between the conductor 20 and the ground line 15.

It is also observed in FIG. 3 that the ratio of the lengths of the lines 22 and 23 is reversed with respect to that of FIG. 2.

Indeed this ratio is not critical but is in fact determined by the presence of the capacitor 26 which is preferably placed as close as possible to the midpoint 29 in order to ensure optimum performance of its design function which consists in blocking the intermediate frequency supplied by the result of the mixing operation.

The mixer which has just been described has been fabricated within a casing having dimensions of 18×15 millimeters and exhibits relatively low conversion losses of the order of 6 dB at frequencies in the vicinity of 2 GHz.

The miniaturization thus obtained represents a considerable improvement over the symmetrical mixers which make use of the balun system since, at 2 GHz, known mixers have a minimum length of the order of 40 millimeters.

The invention is not limited to the mixer described in the foregoing and, as can readily be understood, is equally applicable to any type of mixer comprising one or a number of diodes in which it is desired to reduce the length of the conductors having a waveguide function for the incident signal. In the case of a mixer comprising one or a number of diodes, the assembly consisting of access conductors 20, 21 and the gap 34 could be retained, the only components to be adapted being the slotted lines which have the function of applying the field of the local oscillator to the terminal of each diode.

What is claimed is:

1. A microwave mixer for producing a mixed wave from an incident wave and a mixing wave, comprising:
   a dielectric substrate having a first and a second end, and a first and a second face in parallel;
   a ground strip line conductor located on the periphery of said first face;
   a first strip conductor, having a first extremity and a second extremity, located on said first face near said first end so as to define a gap between said ground strip line conductor and said first extremity of said first strip conductor;
   a second strip conductor, having a first extremity and a second extremity, located on said second face at said first end so as to be substantially parallel with said first strip conductor, whereby said incident wave is applied between said first extremity of said second strip conductor and said ground strip line conductor;
   first and second series connected diodes, each having an anode and a cathode, said anode of said first diode being connected to said second extremity of said second strip conductor, and said cathode of said second diode being connected to said second extremity of said first strip conductor;
   means for applying an electric field produced by said mixing wave between said anode of said first diode and said cathode of said second diode; and
   output means, connected between said first diode anode and said second diode cathode, for providing said mixed wave.

2. A mixer according to claim 1, wherein the length of each of said first and said second strip conductors is shorter than one-quarter wavelength of said incident wave.

3. A mixer according to claim 2, wherein said gap has a width of a few hundred microns.

4. A mixer according to claim 3, wherein said applying means includes two slotted lines.

5. A mixer according to claim 4, wherein said slotted lines include first and second spaced parallel lines deposited by metallization on said second face, each parallel line being electrically connected to said ground strip line conductor by means of at least one metallized hole extending right through said substrate from one face to the other.

6. A mixer according to claim 5, wherein said diodes are placed on said second face and are connected to said first strip conductor extending right through said substrate from one face to the other.

7. A mixer according to claim 6, wherein said slotted lines include a common strip line conductor located on said second face between and parallel to said first and second parallel lines, a midpoint of said series connected diodes being connected to said common strip line conductor and said first diode anode being connected to said first parallel line and said second diode cathode being connected to said second parallel line.

8. A mixer according to claim 7, wherein said common strip line conductor is divided into two lines elements connected to each other via a capacitor.

9. A mixer according to claim 8, wherein said midpoint of said series connected diodes is connected to said output means by a low-pass filter.

* * * * *